United States Patent
Chae et al.

(12) 
(10) Patent No.: US 6,478,872 B1
(45) Date of Patent: Nov. 12, 2002

(54) METHOD OF DELIVERING GAS INTO REACTION CHAMBER AND SHOWER HEAD USED TO DELIVER GAS

(75) Inventors: Yun-sook Chae; In-sang Jeon; Sang-bom Kang, all of Seoul; Sang-in Lee; Kyu-wan Ryu, both of Kyungki-do, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/467,313

(22) Filed: Dec. 20, 1999

(30) Foreign Application Priority Data

Jan. 18, 1999 (KR) ............................................. 99-1279

(51) Int. Cl.$^7$ ..................... C30B 25/00; C30B 25/02; C30B 25/14; C30B 25/16
(52) U.S. Cl. ......................... 117/88; 117/89; 117/105; 427/255.391
(58) Field of Search ................. 427/248.1, 255.23, 427/255.28, 255.39, 255.391, 255.7; 117/89, 105, 88

(56) References Cited

U.S. PATENT DOCUMENTS

| | | | | |
|---|---|---|---|---|
| 4,990,374 A | * | 2/1991 | Keeley et al. | 427/255.1 |
| 5,316,793 A | * | 5/1994 | Wallace et al. | 427/248.1 |
| 5,595,606 A | | 1/1997 | Fujikawa et al. | |
| 5,772,771 A | * | 6/1998 | Li et al. | 118/723 |
| 5,781,693 A | * | 7/1998 | Ballance et al. | 392/416 |
| 5,851,905 A | * | 12/1998 | McIntosh et al. | 257/94 |
| 5,972,430 A | * | 10/1999 | DiMeo, Jr. et al. | 427/255.32 |

FOREIGN PATENT DOCUMENTS

| | | |
|---|---|---|
| JP | 61-120416 | 6/1986 |
| KR | 97-8372 | 7/1995 |
| KR | 1998-033219 | 7/1998 |
| KR | 1999-020125 | 3/1999 |
| KR | 1999-0057701 | 7/1999 |

OTHER PUBLICATIONS

Office Action (and translation), dated Sep. 15, 2000, issued by the Korean Patent Office in connection with Korean priority application No. 1999-0001279.

* cited by examiner

*Primary Examiner*—Timothy Meeks
*Assistant Examiner*—William Phillip Fletcher, III
(74) *Attorney, Agent, or Firm*—Volentine Francos, PLLC

(57) ABSTRACT

A method of delivering two or more mutually-reactive reaction gases when a predetermined film is deposited on a substrate, and a shower head used in the gas delivery method, function to increase the film deposition rate while preventing formation of contaminating particles. In this method, one reaction gas is delivered toward the edge of the substrate, and the other reaction gases are delivered toward the central portion of the substrate, each of the reaction gases being delivered via an independent gas outlet to prevent the reaction gases from being mixed. In the shower head, separate passages are provided to prevent the first reaction gas from mixing with the other reaction gases by delivering the first reaction gas from outlets formed around the edge of the bottom surface of the shower head. The other reaction gases are delivered from outlets formed in the central portion of the bottom surface of the shower head. Accordingly, one of the mutually-reactive gases is delivered toward the central portion of the substrate, and the others are delivered toward the edge of the substrate.

13 Claims, 7 Drawing Sheets

METHOD OF DELIVERING GAS INTO REACTION CHAMBER AND SHOWER HEAD USED TO DELIVER GAS

BACKGROUND OF THE INVENTION

1. Field of the Invention

The present invention relates to a method of delivering reaction gases during deposition of a predetermined layer onto a substrate with two or more mutually-reactive reaction gases, and a shower head used to introduce the reaction gases.

2. Description of the Related Art

Physical vapor deposition (PVD, also referred to as "sputtering"), chemical vapor deposition (CVD), atomic layer deposition (ALD), and pulsed CVD (PCVD, the details of which will be described later) can be used to form a predetermined layer by depositing a vapor material on a substrate. When a predetermined layer is formed by conventional vapor deposition methods, source gases (reaction gas) are generally provided by a shower head installed at the upper portion of a reaction chamber.

Figure 1:
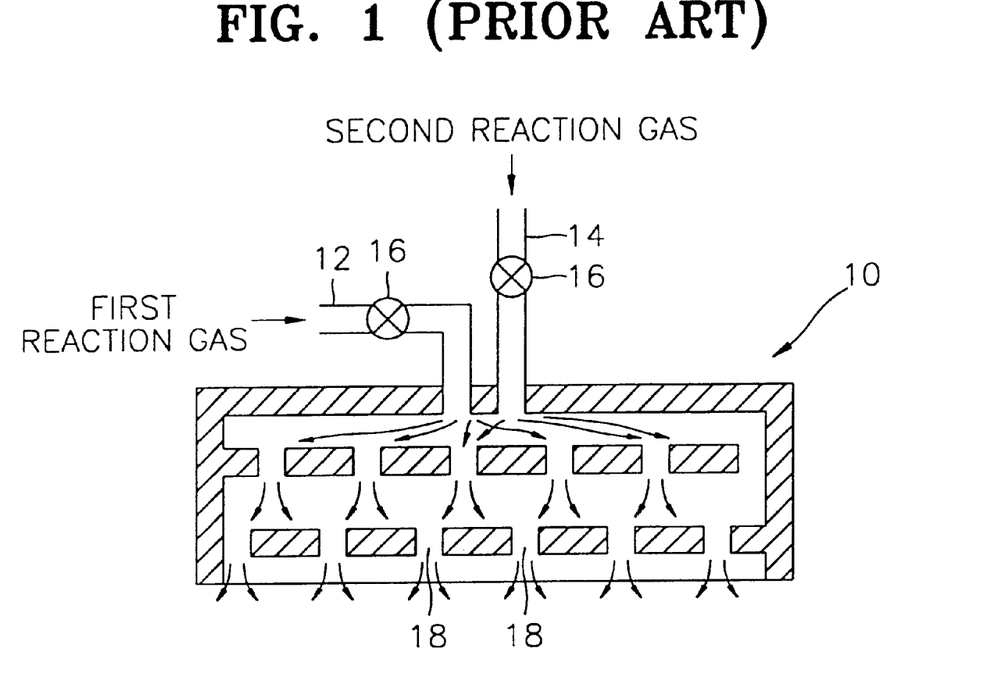
FIG. 1 is a cross-sectional view illustrating the configuration of a conventional mixing-type shower head.
Figure 2:
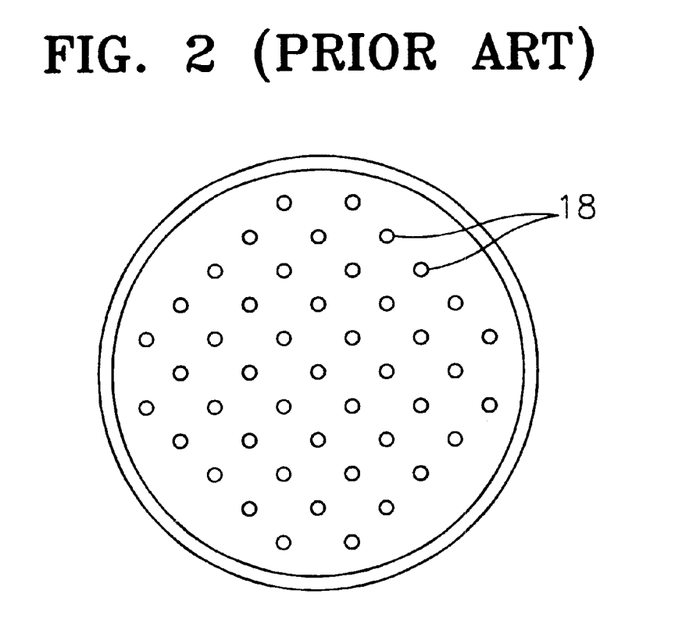
FIG. 2 is a bottom view of the shower head of FIG. 1.

FIGS. 1 and 2 show a mixing-type shower head. Here, first and second reaction gases enter into a shower head 10 at the same time or at different times, according to the opening or closing action of valves 16, via intakes 12 and 14, respectively. The first and second reaction gases are mixed in the shower head 10, exit through outlets 18 on the bottom surface of the shower head 10, and are deposited on a substrate (not shown) loaded in a reaction chamber. However, in the mixing-type shower head 10 having such a configuration, the first and second reaction gases, particularly if they are mutually reactive, react with each other and form particles, which are deposited within the shower head 10. Therefore, the shower head is easily contaminated.

Figure 3:
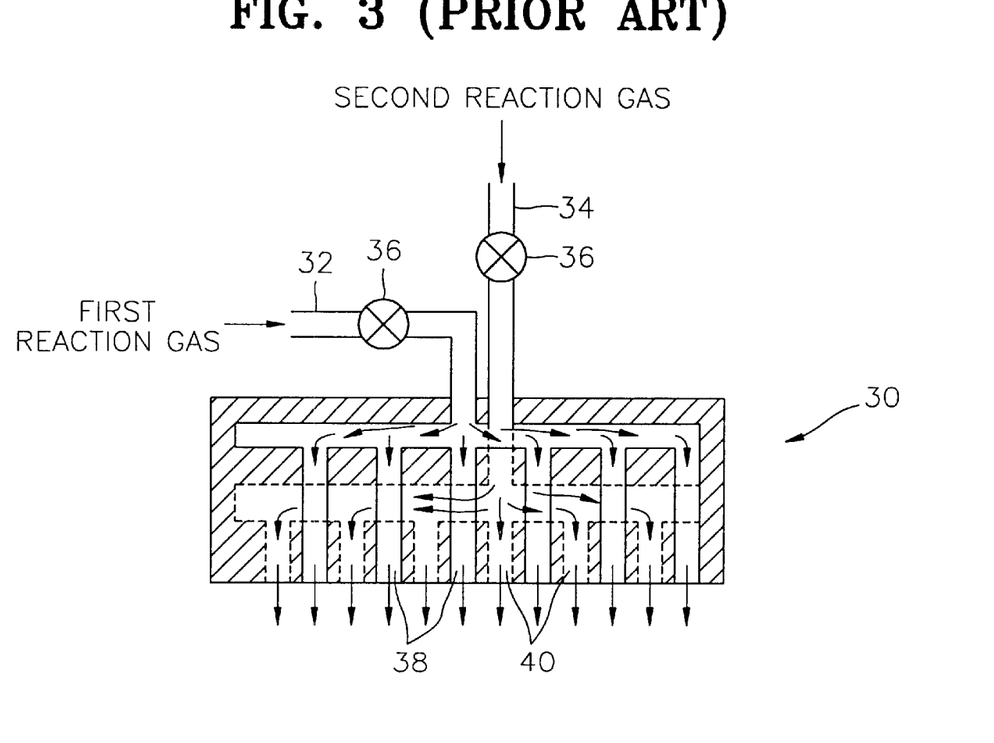
FIG. 3 is a cross-sectional view illustrating the configuration of a conventional separative type shower head.
Figure 4:
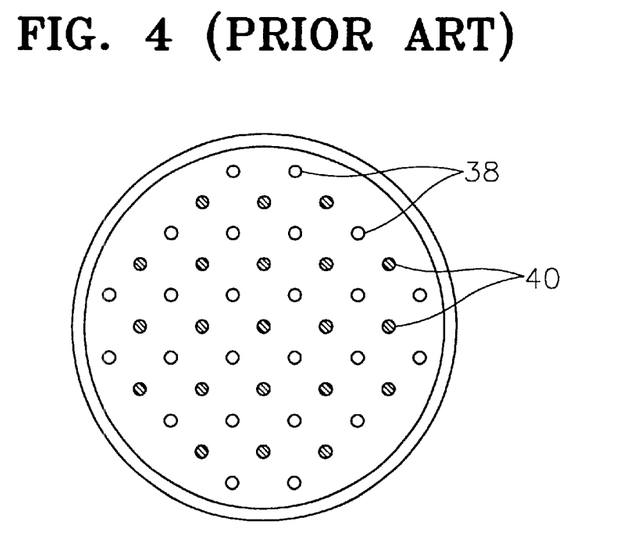
FIG. 4 is a bottom view of the shower head of FIG. 3.

FIGS. 3 and 4 show a separative type shower head 30, for separately providing first and second reaction gases, to solve the above problem. Referring to FIGS. 3 and 4, different passages are provided to prevent the first and second reaction gases from reacting with each other within the shower head 30, such that the first and second reaction gases are discharged respectively via separate sets of interspersed outlets 38 and 40. However, when PCVD is performed using the separative type shower head 30, the first reaction gas and other reactants remaining within the reaction chamber flow backward and into the passage for the second reaction gas, because there is no downward flow at that point coming from the passage for the second reaction gas. Then, when the second reaction gas is delivered, it reacts with the first gas and other reactants, thereby producing contaminating particles. Likewise, the same thing occurs in the passage for the first reaction gas, which becomes contaminated with the second reaction gas when only the second reaction gas is flowing.

Meanwhile, during introduction of the first and second reaction gases, a predetermined amount of inert carrier gas can be used to help carry the reaction gases. Accordingly, the backward flow of a reaction gas through a passage for the other reaction gas which is not being delivered is prevented by continuously delivering the inert carrier gas independently of the delivery of the reaction gas, or by purging the reaction gas remaining within the shower head and the reaction chamber by increasing the flow rate of a purge gas. In the case where the carrier gas is continuously delivered as described above, the carrier gas acts as the purge gas when neither of the two reaction gases is being delivered.

Figure 5:
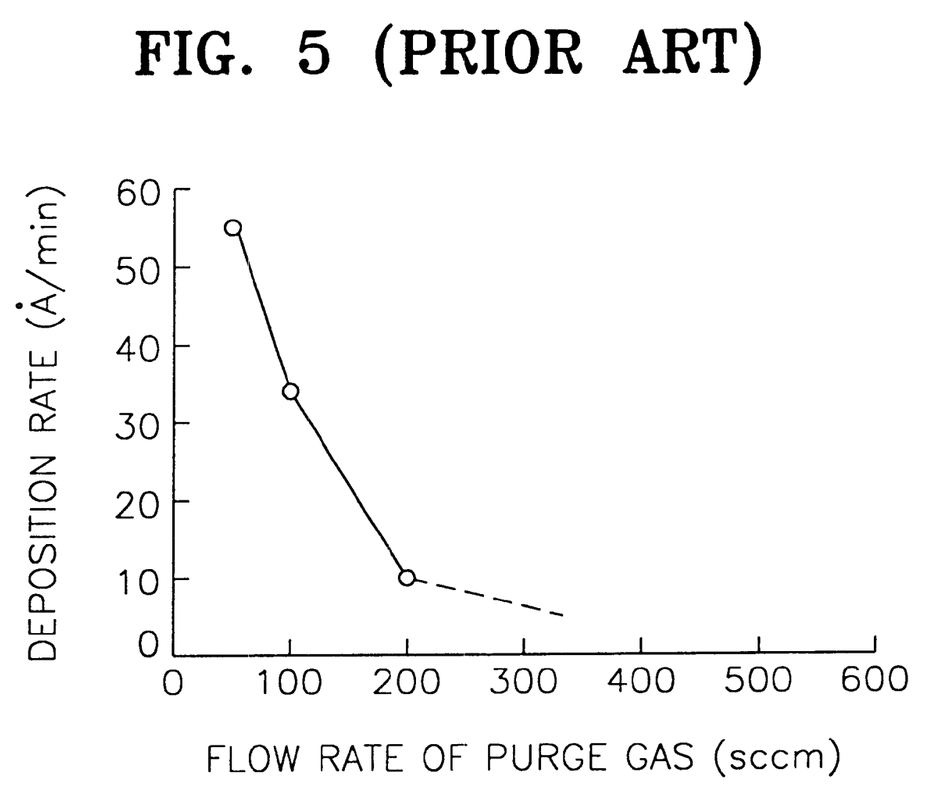
FIG. 5 is a graph showing the relationship between the flow rate of a purge gas and deposition rate when a TiN film is formed on a substrate using the shower head of FIGS. 3 and 4.

However, the continuous delivery of the carrier gas and the increase in the flow rate of the purge gas cause a reaction gas adsorbed on the substrate to be purged, so that the deposition rate of a film is significantly decreased. For example, when a TiN film is deposited by using the shower head shown in FIGS. 3 and 4, the relationship between the flow rate of a purge gas and the deposition rate of the TiN film is shown in FIG. 5. Here, $TiCl_4$ is used as a first reaction gas, $NH_3$ is used as a second reaction gas, and Ar is used as a purge gas. As can be seen from FIG. 5, when the flow rate of purge gas increases to over 200 sccm, the deposition rate of the TiN film falls below 10 Å/min. Therefore, the conventional gas delivery method is not appropriate for a practical mass production process. According to several experiments, it becomes evident that setting the flow rate of purge gas to over about 500 sccm prevents contaminating particles from being produced. However, it can be seen that setting the flow rate of the purge gas to over 500 sccm greatly reduces the speed of growth of the TiN film.

SUMMARY OF THE INVENTION

To solve the above problems, it is an object of the present invention to provide a method of delivering gas whereby problems of both an increase in contaminating particles and a reduction in deposition rate can be solved, and to provide a shower head appropriate for the gas delivery method.

Accordingly, to achieve the first object, the present invention provides a gas delivery method in which a first reaction gas is delivered toward the edge of the substrate, and the other reaction gases are delivered toward the central portion of the substrate, each of the reaction gases being delivered via independent gas outlets to prevent the reaction gases from being mixed. Here, the predetermined film can be deposited by atomic layer deposition (ALD) or pulsed chemical vapor deposition (PCVD).

The other reaction gases include second and third reaction gases each reactive to the first reaction gas, and the second and third reaction gases can be delivered simultaneously with the first reaction gas. The second and third reaction gases can be simultaneously delivered via the same gas outlet to be mixed with each other or alternately delivered via the same gas outlet at different times to prevent the two reaction gases from being mixed. Alternatively, the second and third reaction gases can be delivered via independent gas outlets, respectively, to prevent the two reaction gases from being- mixed.

According to another embodiment of the present invention, there is provided a gas delivery method including: delivering the first reaction gas toward the edge of the substrate for a designated period of time; purging the reaction gas remaining within the reaction chamber while blocking the inflow of the first reaction gas; delivering the second reaction gas toward the central portion of the substrate for a designated period of time; and purging the reaction gas remaining within the reaction chamber while blocking the inflow of the second reaction gas.

In the steps of delivering the first reaction gas and the second reaction gas, each of the first and second reaction gases is delivered together with a carrier gas in order to smoothly supply the first and second reaction gases. The reaction chamber is purged by continuously delivering only the carrier gas while blocking the first and second reaction gases during each of the purging steps. Also, the first reaction gas delivering step, the purging step, the second reaction gas delivering step, and the purging step can be repeated to deposit the material to a desired thickness.

The shower head appropriate for carrying out the above method is installed at the upper portion of a reaction chamber in which a substrate is seated on the lower portion. The shower head has a gas supply line formed on the upper surface of the shower head for receiving a first reaction gas from a supply source of the first reaction gas; gas supply lines formed on the upper surface of the shower head for receiving other reaction gases from a supply source of the other reaction gases; a plurality of outlets for the first reaction gas formed along the edge of the lower surface of the shower head for discharging the first reaction gas; a plurality of outlets for each of the other reaction gases formed on the central portion of the lower surface of the shower head, for discharging the other reaction gases; a gas passage formed within the body of the shower head, for connecting the gas supply line for the first reaction gas to the plurality of outlets for the first reaction gas; and gas passages formed independently of the gas passage for the first reaction gas within the body of the shower head, for connecting the supply lines for the other reaction gases to the plurality of outlets for each of the other reaction gases.

Here, the plurality of outlets for the first reaction gas can be extended further downward toward the substrate than the plurality of outlets for each of the other reaction gases such that the plurality of outlets for the first reaction gas are closer to the substrate installed in the chamber than the plurality of outlets for each of the other reaction gases when the shower head is installed in the upper portion of the reaction chamber.

According to the present invention, one of the mutually-reactive reaction gases is delivered toward the edges of a substrate, and the others are delivered independently toward the center of the substrate. Thus, generation of contaminating particles within a shower head and a reaction chamber can be prevented, and a high deposition rate can be obtained.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE PREFERRED EMBODIMENTS

Hereinafter, preferred embodiments of the present invention will be described referring to the attached drawings.

First, the structure of a shower head appropriate for a gas delivery method according to the present invention will be described.

Figure 6:
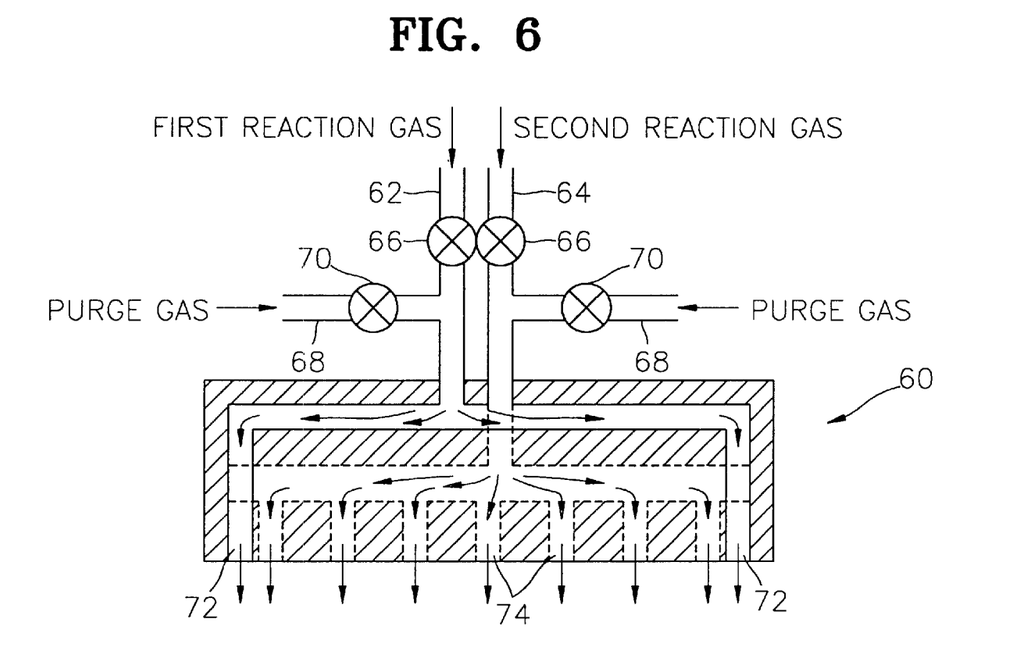
FIG. 6 is a cross-sectional view illustrating the configuration of an embodiment of a shower head used in a gas delivery method according to the present invention.
Figure 7:
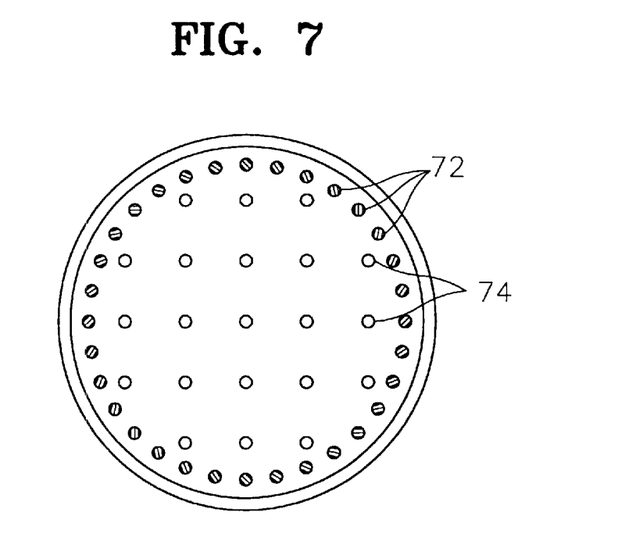
FIG. 7 is a bottom view of the shower head of FIG. 6.

FIGS. 6 and 7 show the configuration of a shower head according to an embodiment of the present invention. As shown in FIG. 6, gas supply lines 62 and 64, for first and second reaction gases, and respective valves 66 are installed over a shower head 60 according to the present embodiment. Supply lines 68 for a purge gas (carrier gas) transfer the first and second reaction gases and purge the shower head 60 and a reaction chamber (not shown). Supply lines 68 are equipped with valves 70.

The interior of the shower head 60 has passages for first and second reaction gases to prevent the first and second reaction gases from being mixed. In particular, one reaction gas is allowed to be discharged to outlets 72 formed around the outer edge of the bottom surface of the shower head 60, and the other reaction gas is allowed to be discharged to outlets 74 formed in a central portion of the bottom surface of the shower head 60. That is, as shown in FIG. 7, the bottom surface of the shower head 60 is provided with a plurality of first reaction gas outlets 72 which are spaced apart from each other along the edge, and a plurality of second reaction gas outlets 74 which are spaced apart from each other in the central portion.

In particular, instead of being interspersed across the bottom surface of the conventional shower head as shown in FIG. 4, the first reaction gas outlets 72 are grouped around the outside edge of the bottom surface of the shower head, and the second reaction gas outlets 74 are grouped in the central portion of the bottom surface of the shower head. Therefore, when delivering the first reaction gas from the first gas outlets grouped along the outside edge of the bottom surface of the shower head, there is less backward flow of the first reaction gas into the gas outlets for the second reaction gas than there would be in the conventional interspersed shower head.

A third reaction gas which is reactive to the first reaction gas can be supplied together with the second reaction gas through the second reaction gas supply line 64. Here, if the second and third reaction gases do not react with each other or weakly react with each other, they can be supplied simultaneously. On the other hand, if they are reactive, they can be alternately supplied at different times.

Figure 8:
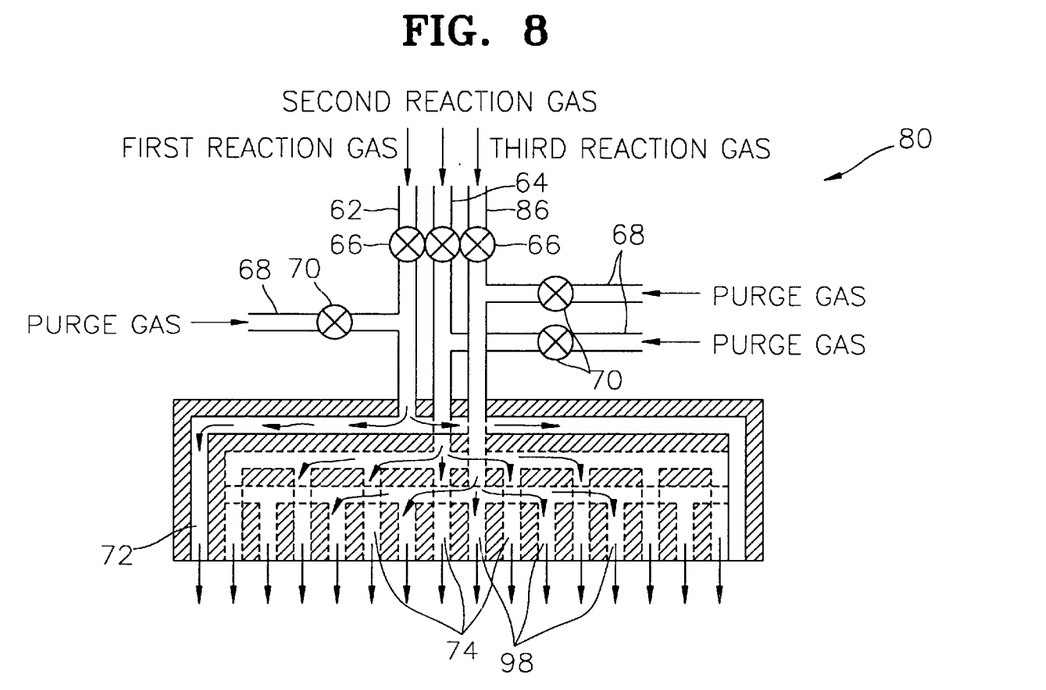
FIG. 8 is a cross-sectional view illustrating the configuration of another embodiment of a shower head used in a gas delivery method according to the present invention.
Figure 9:
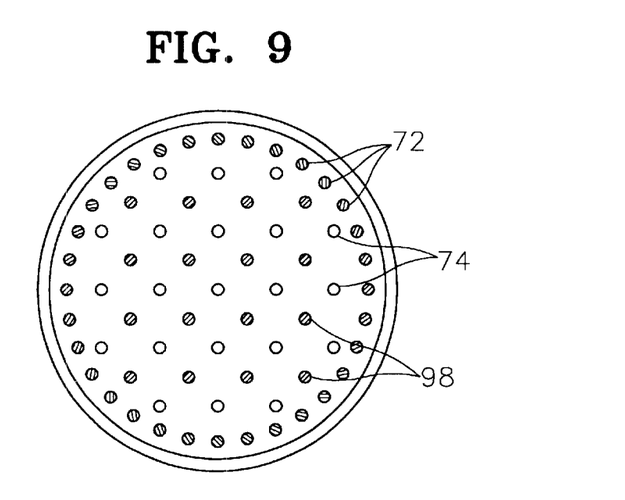
FIG. 9 is a bottom view of the shower head of FIG. 8.

FIGS. 8 and 9 show the configuration of a shower head according to another embodiment of the present invention. The shower head 80 shown in FIGS. 8 and 9 is obtained by further adding a third reaction gas supply line 86 and third reaction gas outlets 98 to the shower head shown in FIGS. 6 and 7. Here, third reaction gas outlets 98 are independent of first and second reaction gas outlets 72 and 74. Third reaction gas passages for connecting the third reaction gas supply line 86 to each of the third reaction gas outlets 98 are separate from the first and second reaction gas passages, such that the three reaction gases can be delivered independently of one another. Third reaction gas supply line 86 is also provided with a purge gas line 68 and valve 70.

In any of the shower heads of FIGS. 6 through 9, the first reaction gas outlets 72 can be extended farther downward than the second/third reaction gas outlets 74 and 98, so that the first reaction gas outlets 72 are closer to a substrate loaded in a reaction chamber. This is illustrated by reference numeral 142 in FIG. 11. This downward extension of the first reaction gas outlets further assists in preventing backward flow of the first reaction gas into the second (or third) reaction gas outlets. It is also preferable that the first reaction gas outlets 142 face the edge of a substrate or are located beyond the outside of the substrate, so that the diameter of the shower head is greater than or equal to that of the substrate.

A method of delivering gas according to an embodiment of the present invention will now be described. FIGS. 10 through 13 conceptually illustrate processes for delivering gases according to embodiments of the present invention.

Figure 10:
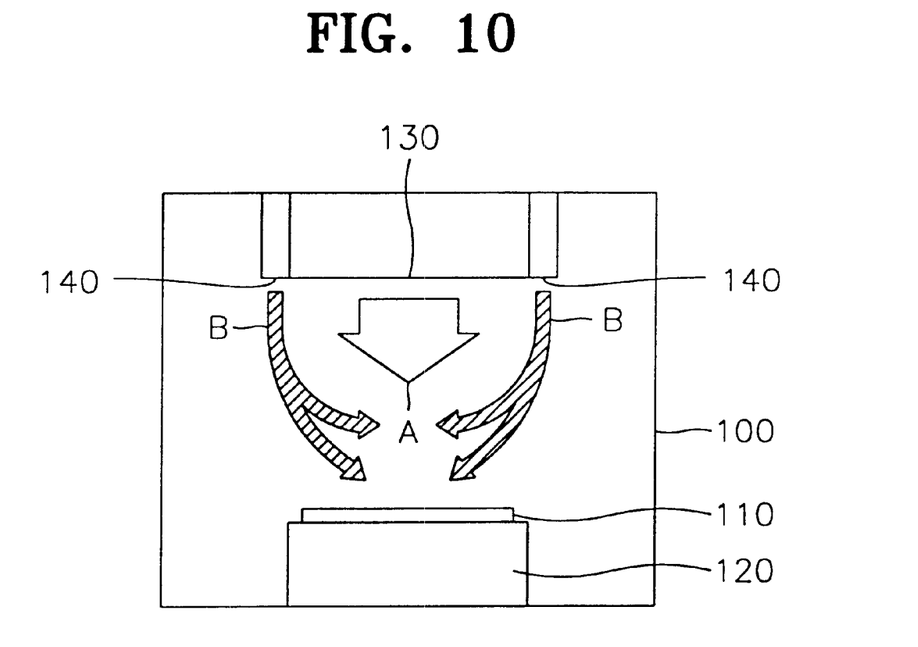
FIGS. 10 through 13 are views conceptually illustrating a gas delivery method according to embodiments of the present invention.

Referring to FIG. 10, a first reaction gas and a carrier gas come out of outlets 140 formed on the edge of a shower head and flow toward the edge of a substrate 110 loaded on a substrate holder 120 in a reaction chamber 100, as indicated by arrows B. A second reaction gas and a carrier gas come out of outlets 130 formed in the central portion of the shower head and flow toward the central portion of the substrate 110, as indicated by arrow A. In this way, a direct purging effect of a purge gas (carrier gas) on a substrate is reduced, so that a reduction in the deposition rate is prevented despite an increase in the flow rate of the purge gas. In addition, since the outlets 130 and 140 are segregated from each other, the first and second reaction gases cannot easily flow backward into outlets for the second and first reaction gases respectively, so that contamination of the interior of the shower head and gas lines is prevented.

Here, it is preferable that the first reaction gas outlets 140 face the outside edge of the substrate 110 or are located beyond the edge of the substrate 110 in order to prevent excessive purging of the second reaction gas adsorbed on the substrate 110. This is easily accomplished by using a shower head whose diameter is greater than or equal to the diameter of the substrate, as described above.

Figure 11:
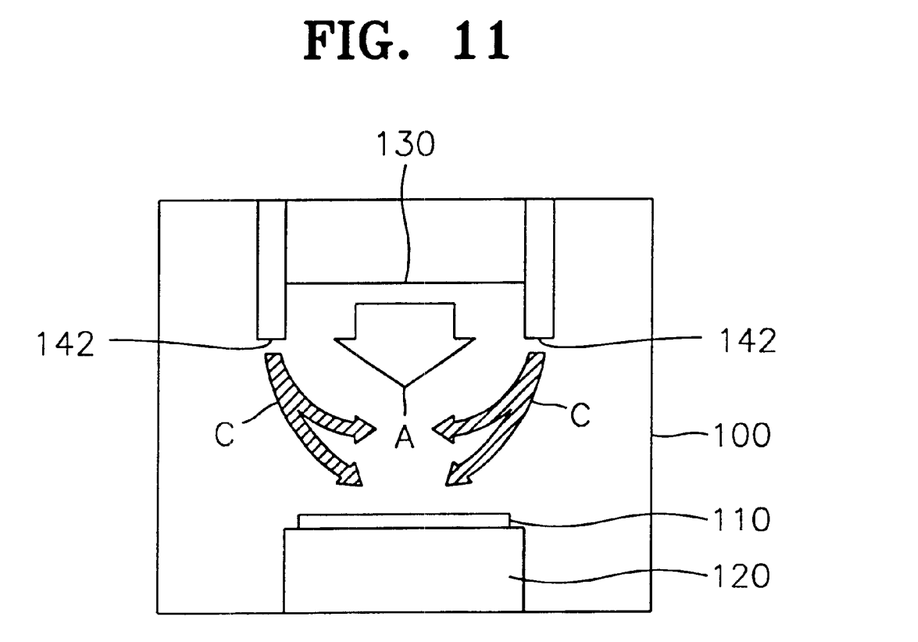

FIG. 11 conceptually shows a process for delivering a gas according to another embodiment of the present invention. The same reference numerals as those in FIG. 10 denote the same elements, so they will not be described in detail.

In the embodiment of FIG. 11, a mutual backward flow between the first reaction gas C and the second reaction gas A can be even more effectively prevented by using a shower head having a structure in which first reaction gas outlets 142 extend farther toward the substrate 110 than the second reaction gas outlets 130.

Figure 12:
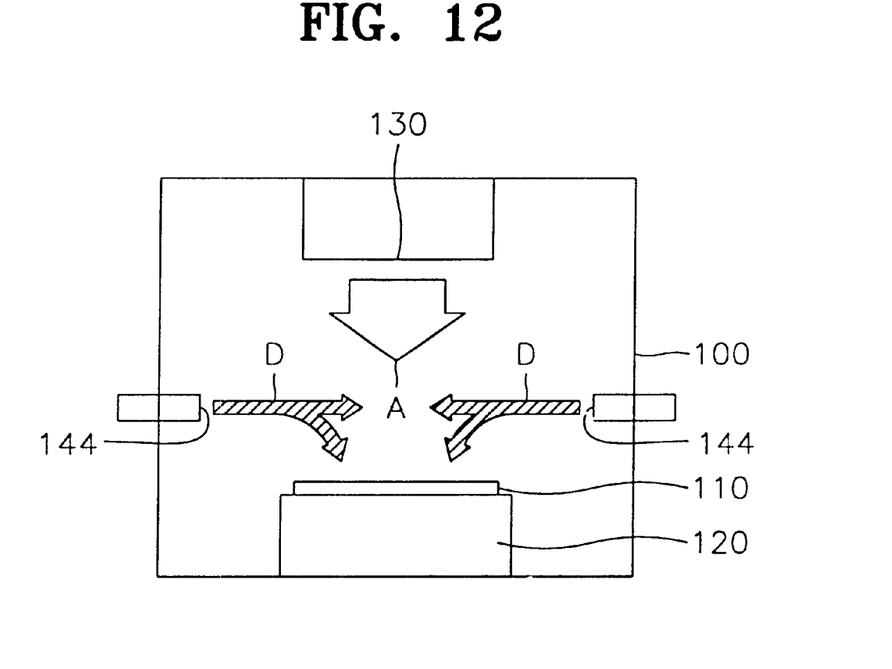

In another embodiment as shown in FIG. 12, only the second reaction gas is delivered as indicated by arrow A, and the first reaction gas is delivered laterally from gas outlets 144 located in the sides of the reaction chamber toward the substrate 110 as indicated by arrows D.

Figure 13:
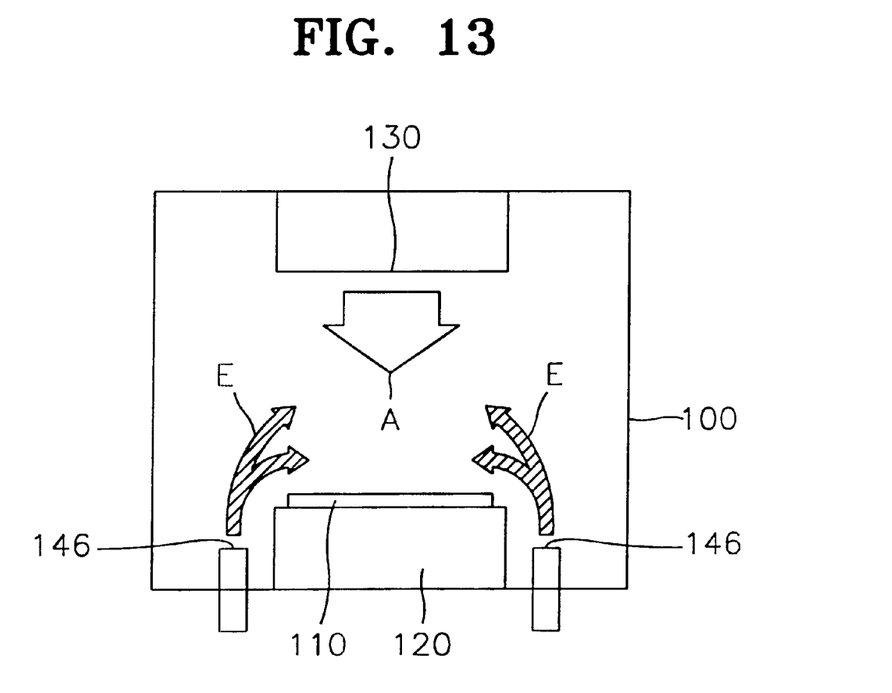

In still another embodiment as shown in FIG. 13, only the second reaction gas is delivered from a shower head as indicated by arrow A, and the first reaction gas is delivered upward from gas outlets 146 located at the edge of the lower portion of the reaction chamber as indicated by arrows E.

The first and second reaction gases in the above-described embodiments can be delivered in a PCVD method. PCVD is more fully described in U.S. patent application Ser. No. 09/156,724 filed on Sep. 18, 1998 by a common Assignee, entitled "Method of Forming Metal Nitride Film by Chemical Vapor Deposition and Method of Forming Metal Contact of Semiconductor Device Using the Same", the disclosure of which is hereby incorporated herein by reference in its entirety. As described in U.S. patent application Ser. No. 09/156,724, PCVD is a type of CVD where reaction gases and purge gases are alternately introduced for a predetermined amount of time in a sequence of a first reaction gas, a purge gas, a second reaction gas, and the purge gas. PCVD is similar to ALD, but PCVD significantly increases the deposition rate with both chemically-adsorbed and physically-adsorbed reaction gases remaining on a substrate, while only the chemically-adsorbed reaction gas remains on the substrate in the ALD.

The embodiment according to the present invention applied to the PCVD will now be described in detail.

First, a semiconductor wafer 110 or a wafer boat (not shown) on which a plurality of substrates are loaded is loaded into a reaction chamber 100 structured as shown in any of FIGS. 10 through 13. The temperature and pressure within the reaction chamber 100 are set to predetermined levels and stabilized.

Next, a valve installed on the first reaction gas supply line is opened, and a first reaction gas is thus delivered for a predetermined period of time as indicated by arrow B, C, D or E. The first reaction gas delivered toward the edge of the wafer 110 is physically or chemically adsorbed on the wafer 110. Here, a carrier gas together with the first reaction gas can be delivered for a smooth supply of the first reaction gas. An inert gas is used as the carrier gas, and can be delivered via the supply line 68 for a purge gas.

The valve installed on the first reaction gas supply line is closed to block the supply of the first reaction gas, and the purge gas is delivered for a predetermined period of time to purge reaction gases remaining within the shower head or the reaction chamber without being adsorbed on the wafer 110. Here, when the carrier gas is delivered together with the first reaction gas, purging is performed by blocking only the first reaction gas and continuously delivering the carrier gas, without the need to deliver a special purge gas.

A second reaction gas is delivered for a predetermined period of time as indicated by the arrows A. The second reaction gas delivered toward the central portion of the wafer 110 reacts with the first reaction gas adsorbed on the wafer 110 to form a desired material film. Here, an inert carrier gas can be delivered together with the second reaction gas to achieve a smooth supply of the second reaction gas.

A purge gas is delivered for a predetermined period of time while blocking the supply of the second reaction gas, thereby purging reaction gases or contaminating particles remaining within the shower head and the reaction chamber. Here, when a carrier gas is delivered together with the second reaction gas, the carrier gas is continuously delivered while only the second reaction gas is blocked, thereby performing a purging operation without the need to deliver a special purge gas.

Such a cycle of delivering the first reaction gas, purging, delivering the second reaction gas, and purging can be repeated until a material film having a desired thickness is formed. Also, the order of the first and second reaction gases to be delivered can be changed according to the property of a film desired to be formed.

An experimental example is provided below, wherein a material film is deposited on a substrate by a PCVD method using a gas delivery method according to the present invention.

In the present experimental example, a TiN film is formed on a substrate using each of the shower heads shown in FIGS. 3 and 6 to compare the effect of a conventional gas delivery method with that of a gas delivery method according to the present invention. $NH_3$ and $TiCl_4$ are used as first and second reaction gases, respectively, and Ar is used as both a carrier gas and a purge gas. The process conditions and one cycle of each of the conventional gas delivery method and the gas delivery method according to the present invention are as follows.

1. Conventional gas delivery method temperature of substrate: 500° C.

pressure: 3 torr one cycle: NH$_3$100 sccm+Ar 120 sccm (2 sec)→Ar 120 sccm (4 sec)→TiCl$_4$3 sccm+Ar 120 sccm (2 sec)→Ar 120 sccm (4 sec)

2. Gas delivery method according to the present invention temperature of substrate: 500° C.

pressure: 4 torr one cycle: NH$_3$100 sccm+Ar 600 sccm (2 sec)→Ar 600 sccm (4 sec)→TiCl$_4$3 sccm+Ar 600 sccm (2 sec)→Ar 600 sccm (4 sec)

The results obtained by performing tens of cycles under the above-described conditions are shown in the following Table 1:

|  | conventional method | method according to the present invention |
|---|---|---|
| deposition rate (Å/min) | ≈30 | >30 |
| number of contaminating particles | >8000 | <50 |
| surface resistance ($\mu\Omega$-cm) | 150 | 116 |
| uniformity (%) of surface resistance | 14.3 (standard deviation) | 8.4 (standard deviation) |
|  | 30 (maximum deviation) | 14.1 (maximum deviation) |

As can be seen from Table 1, although the two methods have similar deposition rates, they differ widely from each other in the number of contaminating particles formed on a substrate. That is, more than 8000 contaminating particles are observed in the conventional method, but less than 50 contaminating particles are observed in the method according to the present invention. As described above, when the flow rate of the carrier and purge gas (Ar) is increased in the conventional method, the number of contaminating particles is reduced. If the flow rate of Ar is increased to 600 sccm without a change in the other conditions in the conventional method having the above-described conditions, the number of contaminating particles is reduced, but the deposition rate is decreased to 8 Å/min or less. This low deposition rate impedes the use of the conventional method in a mass-production method of semiconductor devices.

Also, it is evident that the method according to the present invention can obtain superior results compared to the conventional method not only in the deposition rate and the number of contaminating particles, but also in the surface resistance and the uniformity of the surface resistance. That is, it is preferable that a deposited TiN film in the present experimental example has a surface resistance as low as possible since it is generally used as a barrier metal layer. As can be seen from Table 1, the method according to the present invention obtains a smaller surface resistance than the surface resistance of the conventional method, and also obtains excellent results in the uniformity of the surface resistance. Here, the surface resistance was measured at 49 different places on a substrate by a four-point probe method.

The embodiments according to the present invention and experimental example of a method of delivering mutually-reactive first and second reaction gases have been disclosed above. The gas delivery method according to the present invention is applicable not only to a deposition process using two reaction gases but also to a deposition process using three reaction gases or more such as BST ((Ba,Sr)TiO$_3$) or the like. In such a deposition process using three reaction gases, reaction gases can be delivered via the shower head 80 shown in FIG. 8. Here, the reaction gas which most easily flows backward is supplied to the edge of the substrate via the first reaction gas supply line 62, and the remaining reaction gases are supplied to the central portion of the substrate via the second and third reaction gas supply lines 64 and 86. In a case when the second and third reaction gases do not mutually react with each other or weakly react with each other, the shower head 60 shown in FIG. 6 or a gas delivery system shown in FIGS. 10 through 13 can be used. That is, one reaction gas having a strong reactivity is delivered toward the edge of the substrate via the first reaction gas supply line 62 (or as indicated by arrow B, C, D or E) while the remaining second and third reaction gases are delivered toward the central portion of the substrate via the second reaction gas supply line 64 (or as indicated by arrow A). Here, the second and third reaction gases can be delivered simultaneously, or can be delivered alternately at different times.

According to the gas delivery method and the shower head according to the present invention as described above, in which mutually-reactive reaction gases are delivered to a substrate, one of the mutually-reactive gases is delivered toward the edge of the substrate, and the others are delivered toward the central portion of the substrate. Therefore, the deposition rate can be increased, and contaminating particles can be prevented from being produced within the shower head and a reaction chamber.

The present invention is not limited to the embodiments set forth above, and it is clearly understood that many variations may be made within the scope of the present invention by anyone of skill in the art.

What is claimed is:

1. A method of delivering into a reaction chamber at least two mutually-reactive reaction gases to form a film on a substrate seated within the reaction chamber, the method comprising:

delivering a first one of the mutually-reactive reaction gases into the reaction chamber toward the outer peripheral edge of the substrate, via first gas outlets, for a first designated period of time; and delivering a second one of the mutually-reactive reaction gases into the reaction chamber toward a central portion of the substrate, via second gas outlets discrete from the first gas outlets, during a time different from when the first one of the mutually-reactive reaction gases is being delivered into the reaction chamber through said first gas outlets;

wherein the first and second ones of the mutually-reactive reaction gases are alternately delivered into the reaction chamber via the respective first gas outlets and second gas outlets to prevent the first and second ones of the mutually-reactive reaction gases from mixing with each other within the first and second gas outlets.

2. The method as claimed in claim 1, wherein each of the first and second ones of the reaction gases is delivered into the reaction chamber together with a carrier gas.

3. The method as claimed in claim 2, wherein the carrier gas is inert.

4. The method as claimed in claim 2, and further comprising purging the reaction chamber by delivering only the carrier gas for a period of time occurring between the times at which the first and second ones of the reaction gases are being delivered into the reaction chamber.

5. The method as claimed in claim 1, and further comprising delivering a third reaction gas into the reaction chamber, via said second gas outlets, so as to mix with the second one of the reaction gases during their delivery into the reaction chamber, the first and third reaction gases being mutually-reactive.

6. The method as claimed in claim 1, further comprising delivering a third reaction gas into the reaction chamber, via third gas outlets discrete from said first and second gas outlets, during a time different from the times the first and second ones of the reaction gases are being delivered into the reaction chamber, the first and third reaction gases being mutually-reactive, wherein the first, second and third reaction gases are alternately delivered into the reaction chamber via the respective first gas outlets, second gas outlets and third gas outlets to prevent the reaction gases from mixing with each other within the first, second and third gas outlets.

7. The method as claimed in claim 1, wherein said delivering of the first one of the mutually-reactive reaction gases into the reaction chamber comprises directing the first reaction gas downward into an upper peripheral portion of the reaction chamber, and said delivering of the second one of the mutually-reactive reaction gases into the reaction chamber comprises directing the second reaction gas downward into a central upper portion of the reaction chamber.

8. The gas delivery method as claimed in claim 1, wherein said delivering of the first one of the mutually-reactive reaction gases into the reaction chamber comprises directing the first reaction gas laterally inward from a peripheral portion of the reaction chamber, and said delivering of the second one of the mutually-reactive reaction gases into the reaction chamber comprises directing the second reaction gas downward into a central upper portion of the reaction chamber.

9. The gas delivery method as claimed in claim 1, wherein said delivering of the first one of the mutually-reactive reaction gases into the reaction chamber comprises directing the first reaction gas upward into an lower peripheral portion of the reaction chamber, and said delivering of the second one of the mutually-reactive reaction gases into the reaction chamber comprises directing the second reaction gas downward into a central upper portion of the reaction chamber.

10. A method of delivering into a reaction chamber a first reaction gas containing elements of a material to be deposited on a substrate seated within the reaction chamber, and a second reaction gas for forming the material by reacting with the first reaction gas, the method comprising steps of:

(a) delivering the first reaction gas into the reaction chamber toward an outer peripheral edge of the substrate, via first gas outlets;

(b) after a period of time has elapsed during the delivering of the first reaction gas, purging the reaction chamber while preventing the first reaction gas from flowing into the reaction chamber;

(c) delivering the second reaction gas into the reaction chamber toward a central portion of the substrate, via second gas outlets discrete from said first gas outlets, and during a time different from when the first reaction gas is being delivered into the reaction chamber; and (d) after a period of time has elapsed during the delivering of the second reaction gas, purging the reaction chamber while preventing the second reaction gas from flowing into the reaction chamber.

11. The gas delivery method as claimed in claim 10, wherein each of the first and second reaction gases is delivered into the reaction chamber together with a carrier gas, and the purging of the reaction chamber comprises continuously delivering only the carrier gas into the reaction chamber while preventing the reaction gas from flowing into the reaction chamber.

12. The method as claimed in claim 11, wherein the carrier gas is inert.

13. The method as claimed in claim 10, wherein the delivering of the reaction gases into the reaction chamber, and the purging of the reaction chamber are repeated to form a layer of the material having a desired thickness on the substrate.

\* \* \* \* \*